United States Patent
Schoonewelle et al.

(10) Patent No.: US 7,649,635 B2
(45) Date of Patent: *Jan. 19, 2010

(54) METHOD FOR DETERMINING A MAP, DEVICE MANUFACTURING METHOD, AND LITHOGRAPHIC APPARATUS

(75) Inventors: Hielke Schoonewelle, Veldhoven (NL); Marcus Emile Joannes Boonman, Waarle (NL); Ralph Brinkhof, Eindhoven (NL); Martin Jules Marie-Emile De Nivelle, Eindhoven (NL); Jan Stoeten, Eindhoven (NL); Erwin Antonius Martinus Van Alphen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/907,571

(22) Filed: Oct. 15, 2007

(65) Prior Publication Data
US 2008/0046183 A1 Feb. 21, 2008

Related U.S. Application Data

(63) Continuation of application No. 11/013,202, filed on Dec. 16, 2004, now Pat. No. 7,292,351, which is a continuation-in-part of application No. 10/736,987, filed on Dec. 17, 2003, now abandoned.

(51) Int. Cl.
*G01B 11/24* (2006.01)
(52) U.S. Cl. .................................. 356/601
(58) Field of Classification Search ......... 356/399–401, 356/237.4, 237.1; 355/53–54; 250/548
See application file for complete search history.

(56) References Cited

U.S. PATENT DOCUMENTS

| 5,153,916 A | 10/1992 | Inagaki et al. |
| 5,191,200 A | 3/1993 | van der Werf et al. |
| 5,229,872 A | 7/1993 | Mumola |
| 5,296,891 A | 3/1994 | Vogt et al. |
| 5,523,193 A | 6/1996 | Nelson |
| 5,969,441 A | 10/1999 | Loopstra et al. |
| 6,046,792 A | 4/2000 | Van Der Werf et al. |

(Continued)

FOREIGN PATENT DOCUMENTS

JP       2001-093813 A    4/2001

(Continued)

OTHER PUBLICATIONS

Japanese Office Action No. 2004-382630, dated Dec. 6, 2007.

*Primary Examiner*—Tarifur R. Chowdhury
*Assistant Examiner*—Isiaka O Akanbi
(74) *Attorney, Agent, or Firm*—Pillsbury Winthrop Shaw Pittman LLP

(57) ABSTRACT

A method according to one embodiment of the invention includes determining a map of a second part of a substrate belonging to a group of substrates. The method includes measuring a first part of at least one substrate belonging to the group to create an average profile map or average height map and computing a map of the second part of the substrate belonging to the group, based on the average profile map or the average height map. The computed map is stored for use during a later determination of a height or tilt of a substrate from the group.

3 Claims, 6 Drawing Sheets

U.S. PATENT DOCUMENTS

| | | | |
|---|---|---|---|
| 6,130,751 A | 10/2000 | Haginiwa et al. | |
| 6,208,407 B1 | 3/2001 | Loopstra | |
| 6,411,387 B1 | 6/2002 | Kaneko et al. | |
| 6,674,510 B1 * | 1/2004 | Jasper et al. | 355/55 |
| 6,822,745 B2 * | 11/2004 | De Groot et al. | 356/496 |
| 6,906,785 B2 | 6/2005 | Queens et al. | |
| 2001/0043333 A1 * | 11/2001 | Groot et al. | 356/511 |
| 2002/0167651 A1 | 11/2002 | Boonman et al. | |
| 2002/0173085 A1 | 11/2002 | Nakajima et al. | |
| 2004/0129859 A1 | 7/2004 | Sonksen et al. | |
| 2005/0186483 A1 * | 8/2005 | Schoonewelle et al. | 430/4 |

FOREIGN PATENT DOCUMENTS

| | | |
|---|---|---|
| JP | 2003-257818 A | 9/2003 |
| JP | 2003-264138 A | 9/2003 |
| WO | 98/33096 | 7/1998 |
| WO | 98/38597 | 9/1998 |
| WO | 98/40791 | 9/1998 |

* cited by examiner

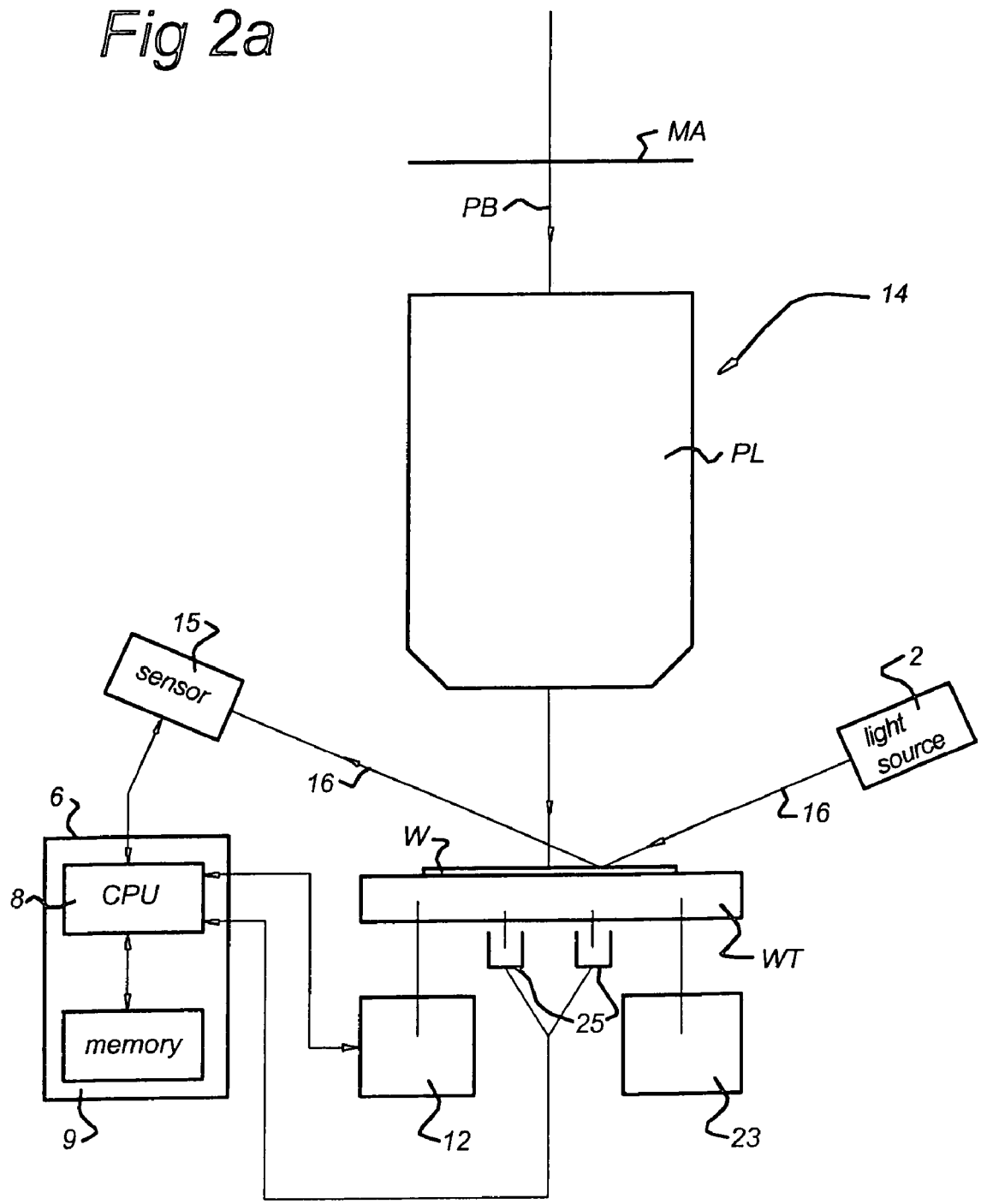

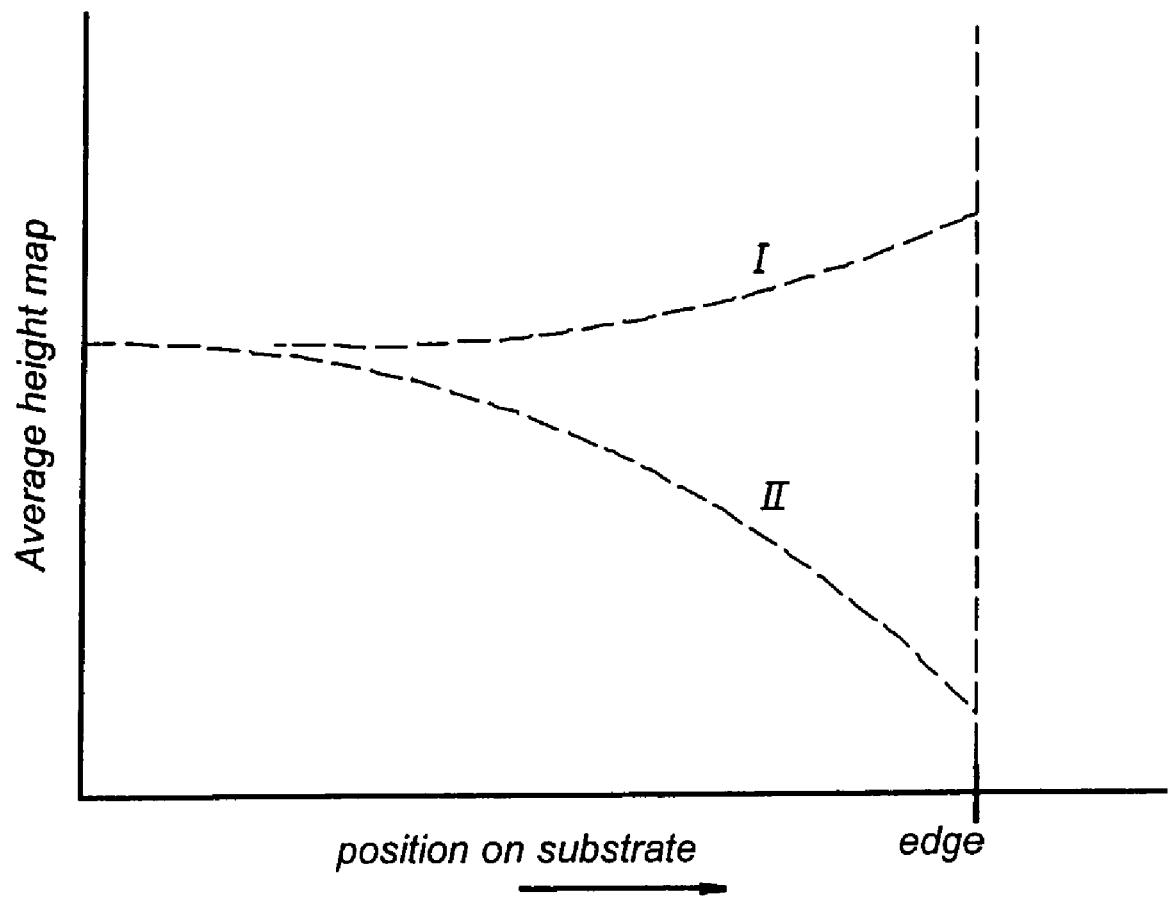

METHOD FOR DETERMINING A MAP, DEVICE MANUFACTURING METHOD, AND LITHOGRAPHIC APPARATUS

RELATED APPLICATIONS

This application is a continuation of U.S. patent application Ser. No. 11/013,202 filed Dec. 16, 2004, which is a continuation-in-part of and claims benefit of U.S. patent application Ser. No. 10/736,987 filed Dec. 17, 2003, each application of which is hereby incorporated by reference.

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example., which may be fixed or movable as required.

The support structure supports (i.e., bears the weight of) the patterning structure. It holds the patterning structure in a way depending on the orientation of the patterning structure, the design of the lithographic apparatus, and other conditions (such as, for example, whether or not the patterning structure is held in a vacuum environment). The support can be using mechanical clamping, vacuum, or other clamping techniques (for example, electrostatic clamping, possibly under vacuum conditions). The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure". For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

A substrate may not be perfectly flat, and leveling the substrate as well as possible in the focal plane of the projection system may be difficult, especially for target portions at or close to a periphery of the substrate.

SUMMARY

A method of determining a map of a surface according to an embodiment of the invention includes measuring a first part of a substrate belonging to a group of substrates and, based on a result of the measuring, computing a map of a second part of at least one substrate belonging to the group, where the first part at least partially overlaps with the second part. Methods according to other embodiments also include determining a height or tilt of a substrate belonging to the group and applying the map to correct the determined height or tilt. Apparatus (e.g. measurement and/or lithographic apparatus) and computer-readable media including instructions for executing such a method are also disclosed herein.

BRIEF DESCRIPTION OF THE DRAWINGS

Embodiments of the invention will now be described, by way of example only, with reference to the accompanying schematic drawings in which:

FIG. 2a schematically depict a part of a lithographic projection apparatus according to an embodiment of the invention;

FIG. 6 schematically depicts two average height maps.

In the Figures, corresponding reference symbols indicate corresponding parts.

DETAILED DESCRIPTION

Embodiments of the invention include, for example, methods and apparatus that may be used to enable a more accurate determination of the height or tilt of parts of a substrate that cannot be measured by a level sensor.

Figure 1:
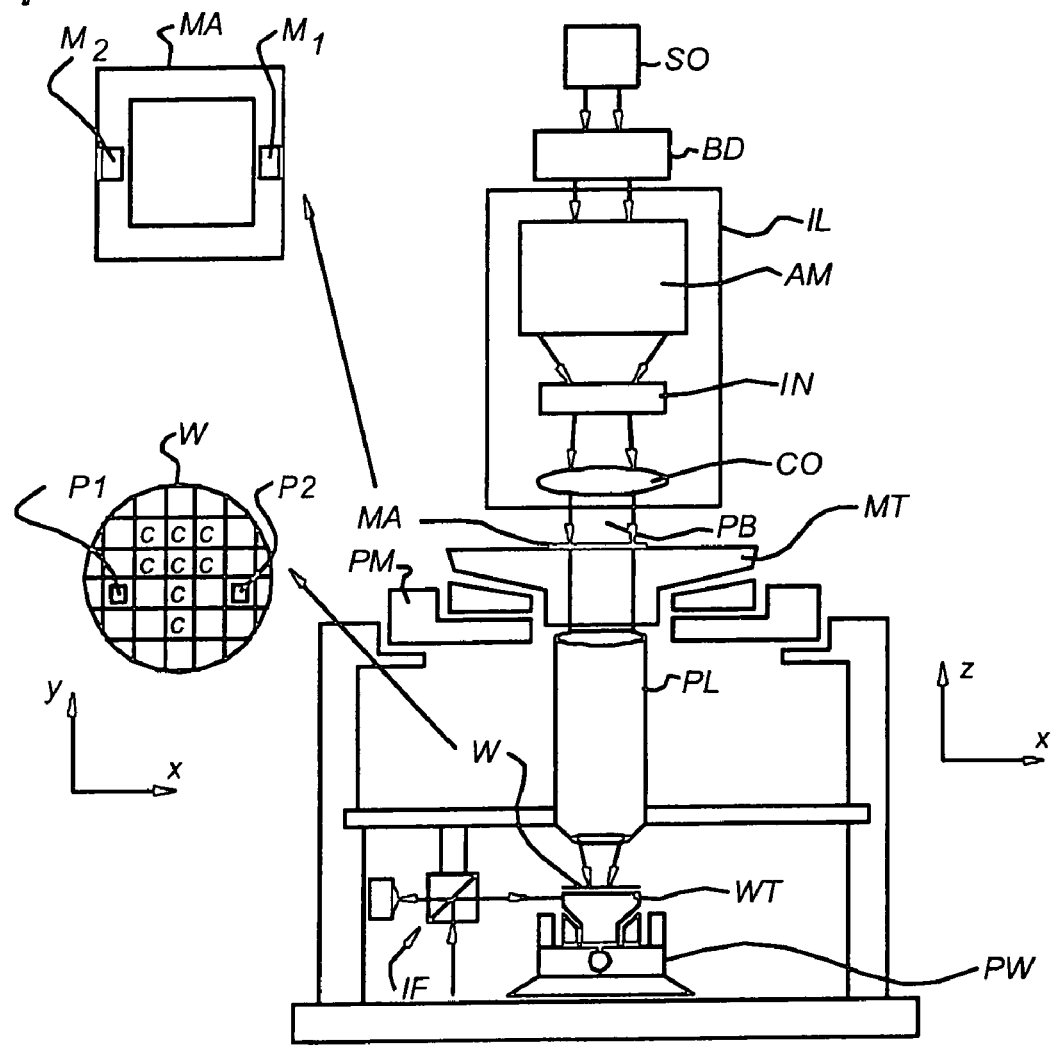
FIG. 1 schematically depicts a lithographic apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system IL including adjusting structure AM for setting an illumination node, an integrator IN, and condensing optics CO;

A support structure configured to support a patterning structure capable of patterning the projection beam. In this example, a first object table (mask table) MT is provided with a mask holder for holding a mask MA (e.g. a reticle), and is connected to a first positioning structure PM for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure PM for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. For example, a beam delivery system BD may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable direction mirrors); this latter scenario is often the case when the source SO is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure PW (and interferometric measuring structure IF), the substrate table WT can be moved accurately, e.g. so as to position different target portions C in the path of the beam PB. Similarly, the first positioning structure PM (and possibly another position sensor) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB. In step mode, the maximum size of the exposure field may limit the size of the target portion C imaged in a single static exposure;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). The velocity and direction of the substrate table WT relative to the mask table MT may be determined by the magnification, demagnification, and/or image reversal characteristics of the projection system PL. In this manner, a relatively large target portion C can be exposed, without having to compromise on resolution. In scan mode, the maximum size of the exposure field may limit the width (in the non-scanning direction) of the target portion in a single dynamic exposure, whereas the length of the scanning motion may determine the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

Figure 2B:
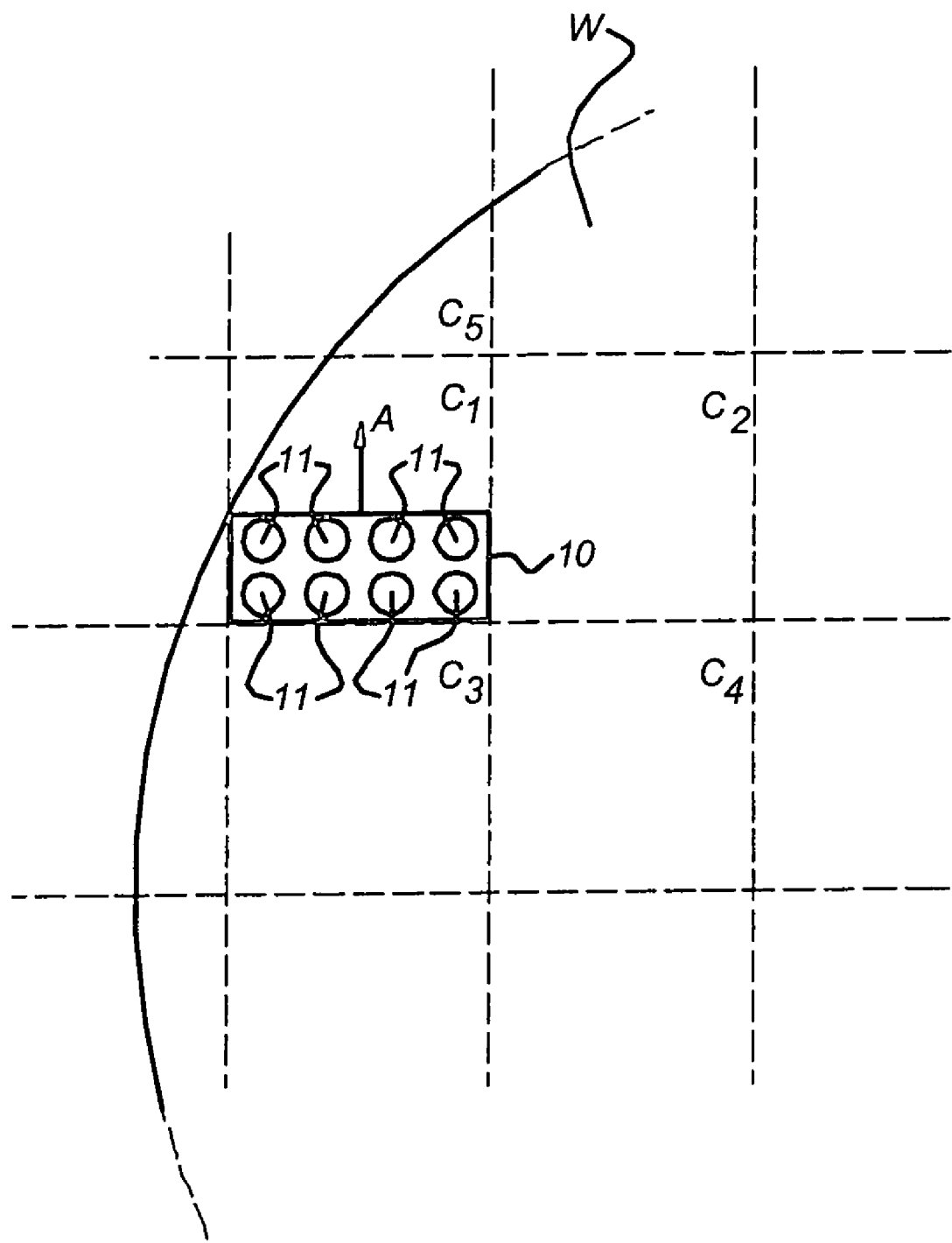
FIG. 2b schematically depicts a substrate divided in a number of target portions.

Discussion of the prior art will be done with reference to FIG. 2b, that schematically depicts a substrate W, divided in a number of target portions $C_i$ (i=1, 2, ... ). The term substrate W used herein should be broadly interpreted as the usable area of the substrate W for exposures, e.g. excluding the focus edge clearance region.

Imaging a pattern onto a substrate W is usually done with optical elements, such as lenses or mirrors. In order to generate a sharp image, a layer of resist on the substrate should be in the focal plane of the optical elements. Therefore, according to the prior art, the height of the target portion $C_i$ that is to be exposed is measured. Based on these measurements, the height of the substrate W with respect to the optical elements is adjusted, e.g. by moving the substrate table on which the substrate W is positioned (not shown). Since a substrate W is not a perfectly flat object, it may not be possible to position the layer of resist exactly in the focal plane of the optics for the whole target portion $C_i$, so the substrate W may only be positioned as well as possible.

In order to position the top surface of the substrate W in the focal plane as well as possible, the orientation of the substrate W may also be altered. The substrate table may be translated, rotated or tilted, in all six degrees of freedom, in order to position the layer of resist in the focal plane as well as possible. This may be necessary for all target portions $C_i$, but especially for the target portions situated on the edge of the substrate, since these target portions are usually slanting, due to the presence of the edge.

In order to determine the best positioning of the substrate W with respect to the optical elements, the surface of the substrate W may be measured using a level sensor, as for instance described in U.S. Pat. No. 5,191,200. This procedure may be done during exposure (on-the-fly), by measuring the part of the substrate W that is being exposed or is next to be exposed, but the surface of the substrate W may also be measured in advance. This latter approach can also be done at a remote position. In the latter case, the results of the measurements may be stored in the form of a so-called height map and used during exposure to position the substrate W with respect to the focal plane of the optical elements.

In both cases, the top surface of the substrate W may be measured with a level sensor that determines the height of a certain area. This area may be a slit 10, having a width about equal to the width of the target portion $C_i$ and having a length that is only part of the length of target portion $C_i$, as is shown in FIG. 2. The height map of a target portion $C_i$ may be measured by scanning the target portion $C_i$ in the direction of the arrow A. The level sensor determines the height of the substrate by applying a multi-spot measurement, such as for instance a 4- or a 8-spot measurement. The spots 11 are spread over the slit 10 and, based on the measurements obtained from the different spots 11, a height map is constructed.

However, it may be difficult or impossible to apply successfully a procedure as described above if the target portion $C_i$ is on the edge of the substrate W and the area in which the level sensor projects its spots is partially outside the substrate W, as is the case in the target portion $C_1$ that is measured in FIG. 2. If the slit 10 is moved in the direction of the arrow A, a number of spots 11 are partially or totally projected outside the surface of the substrate W, and correct spot measurements may not be possible for that part of the target portion $C_1$. The substrate height determination for target portion $C_1$ can then be qualitatively poor due to improper coverage of the target portion $C_1$ with spot measurements, or may even fail if a required combination of spot measurements is not available. Especially the determination of the tilt of the target portion $C_1$ may fail or be qualitatively bad when the combination of spots 11 of the level sensor projected onto the substrate W is less than required. The same problem may occur with target portion $C_5$.

Since a target portion C may comprise several chips, correct projection of the pattern is desired. Even if part of the target portion C is not on the substrate W, some chips may be completely on the substrate and could result in useful products.

According to the prior art, the height of the target portions C, or part of the target portion C, that can no longer be correctly measured using the level sensor was determined based on extrapolation of the height map constructed in neighboring areas on the substrate W. As can be seen in FIG. 2, it may not be possible to measure correctly the top part of the target portion $C_1$ being scanned, since a required combination of spots will not be completely within the boundaries of the substrate W. Therefore, the height map of that part of the target portion $C_1$ was constructed based on previous measurements done in surrounding areas, such as in the neighboring target portion $C_2$, or done at the lower part of the same target portion $C_1$. The results of the height map of those neighboring areas were constructed using extrapolation. The tilt in the area that could not be measured was assumed to equal the tilt determined in a neighboring area, while the height was extrapolated using linear extrapolation.

However, this extrapolation is only correct if the neighboring areas on the substrate W are on a (substantially) flat plane. It is observed that this condition is not always the case, and in particular at the edge of the substrate W the surface is often curved. This curvature may be caused by the shape of the substrate W itself, but may also be caused by the treatment the substrate W has been subjected to, such as polishing steps, or may be caused by the underlying substrate stage to which the substrate W is clamped. The curvature could have different causes, so the curvature could subsequently have different shapes.

In FIG. 2a, a section 14 between the mask MA and the substrate table WT of the lithographic projection apparatus is shown. In the section 14, the so-called projection system PL (e.g. as shown in FIG. 1) is present. The projection system PL contains several elements to guide and condition the projection beam PB of radiation, as is known to persons skilled in the art. After passing the projection system PL, the projection beam PB of radiation hits the surface of the substrate W on the substrate table WT. The wafer table WT will be discussed below in more detail with reference to FIG. 3.

The substrate table WT is connected to actuators 23. These actuators 23 are connected to a control device 6 with a central processing unit (CPU) 8 and a memory 9. The central processing unit 8 further receives information from sensors 25 measuring the actual position of the wafer table WT or wafer table holder, e.g. electrically (capacitive, inductive) or optically (e.g. interferometrically, as shown in FIG. 1).

The CPU 8 also receives input from a sensor 15 which measures the height and/or tilt information from the target area on the wafer where the projection beam PB hits the substrate surface. This sensor 15 will hereinafter further referred to as level sensor, LS. The level sensor may be, for example, an optical sensor; alternatively, a pneumatic or capacitive sensor (for example) is conceivable. It may be desirable for the sensor to be an optical sensor making use of Moire patterns formed between the image of a projection grating reflected by the wafer surface and a fixed detection grating, as described in U.S. Pat. No. 5,191,200. It may be desirable for the level sensor 15 to measure the vertical height of a plurality of positions simultaneously and/or to measure the average height of a small area for each position, so averaging non-flatness of high spatial frequencies. This arrangement comprises a light source 2, projection optics (not shown), and detection optics (not shown). The sensor 15 generates a height dependent signal which is fed to the CPU 8.

A level sensing method may use a multi-spot sensor 15 (for instance, 4 or 8 sensing areas) and measure the average height of a small area, such as a slit 10, as is shown in FIG. 2b, and will be further discussed below.

As already discussed above, FIG. 2b shows a part of a substrate W divided in different target portions $C_i$ (i=1, 2, ...). Since the substrate W has a rounded shape and the target portions C are formed as rectangles, the target portions C situated near the edge are not all completely on the substrate W. When a height map of the substrate W is determined by a level sensor (for instance, by scanning a target portion C with a measurement area, such as a slit 10), the height and/or tilt cannot be determined successfully for the whole target portion $C_1$. When the slit 10 is moved in the direction of the arrow A, a number of spots 11 are partially or totally projected outside the surface of the substrate W, and correct spot measurements may not be possible for that part of the target portion $C_1$. The substrate height determination for target portion $C_1$ can then be qualitatively poor, due to improper coverage of the target portion $C_1$ with spot measurements, or may even fail if the combination of spot measurements available is less than required. Especially the determination of the tilt of the target portion C, may fail or be qualitatively bad when a combination of spots 11 of the level sensor projected onto the substrate W is less than required.

According to the prior art, the height map of parts of the substrate W that cannot be measured accurately with the level sensor may be constructed by extrapolation of the height map of neighboring areas that could still be measured accurately. These neighboring areas may be neighboring target portions $C_2$ or $C_3$, but may also be parts of the same target portion $C_1$ that could still be measured accurately.

Since a substrate W usually exhibits a curvature near the edge of the substrate W, it is possible that the height map will not be determined accurately by sheer extrapolation of the height map determined for adjacent areas.

Some embodiments of the invention relate to the understanding that substrates W that have been subjected to similar circumstances (such as substrates W from a certain batch, substrates W that have been subjected to similar processing steps, and/or substrates W that are clamped to a same chuck) may be expected to have similar curvatures near the edge of the substrate W. Once the shape of this curvature is known, extrapolation can be done more accurately. The shape of the substrate is described by means of an average height map. This average height map contains information about the general shape of a certain substrate under certain situations. The extrapolation from neighboring areas can be done more accurately by using the information from such an average height map.

An average height map may be constructed and may be used to determine a height map for areas on the substrate W that cannot be measured accurately by the level sensor. The average height map could be based on different information, such as the known shape of substrates W from a batch. Also, known effects of treatment steps supplied to the substrate W can be the basis for constructing an average height map, such as a method used to polish the substrate W. The average height map could further be based on a flatness map of the chuck on which the substrate W is positioned. Even the curvature of the underlying stone could be taken into account.

Figure 3:
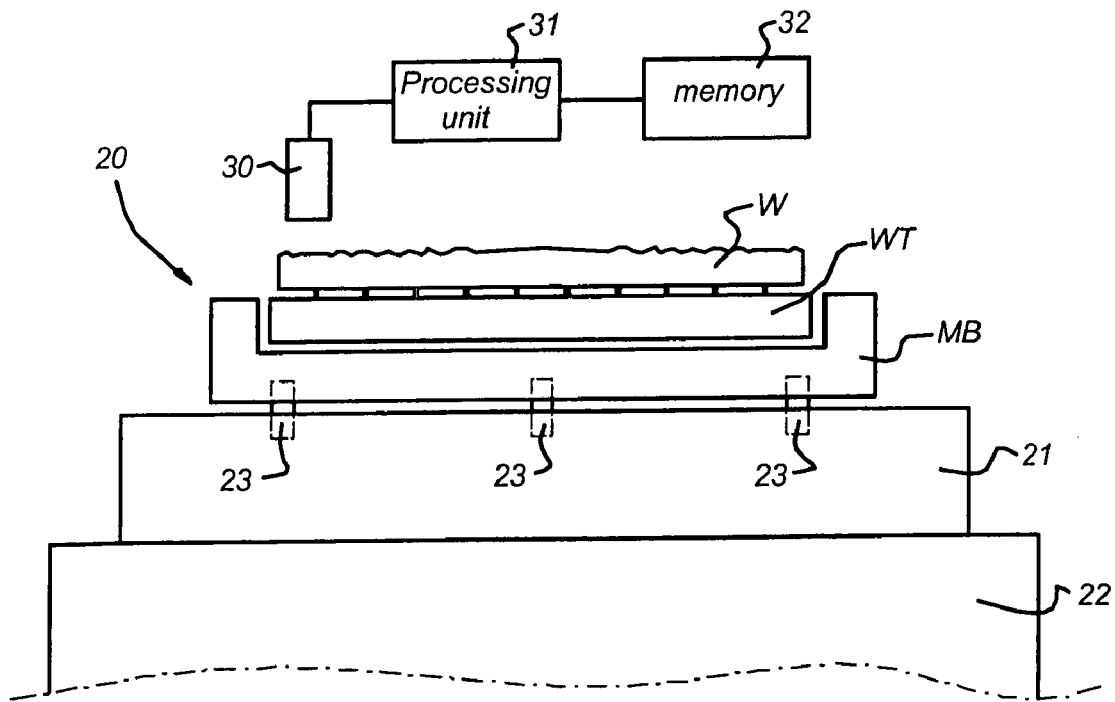
FIG. 3 schematically depicts a substrate positioned on a chuck according to an embodiment of the invention.

FIG. 3 shows a substrate W positioned on a chuck 20, comprising a substrate table WT, a mirror block MB, an air cushion generating device 21, and a stone 22. The mirror block MB is provided with mirrors that may be used by interferometers (not shown in FIG. 3) to determine the position of the chuck, and indirectly the substrate W. The stone 22 is assumed to be a steady base on which an air cushion generating device 21 is positioned. The mirror block MB may be positioned on top of the air cushion generating device 21, e.g. in order to position the mirror block MB free of vibrations. Actuators 23 are positioned in between the mirror block MB and the air cushion generating device 21 to accurately position the mirror block MB. On the mirror block MB, a substrate table WT is positioned, provided with a plurality of pimples on which substrate W can be positioned.

FIG. 3 schematically shows that the top surface of the substrate W may not be completely flat. In fact, also the lower surface of the substrate W may not be completely flat. However, since only the resulting shape of the top surface is relevant here, only the top surface here is depicted as a non-flat surface. The substrate W is clamped to the substrate table WT by means of a clamping mechanism (not shown). Such a clamping mechanism may for instance be an electromagnetic clamping mechanism or a vacuum clamping mechanism.

As already mentioned, the curvature of the substrate W near the edge of the substrate W could have a number of causes, as for instance, the shape of the substrate W itself, the shape of the underlying structure (such as the substrate table WT), or the effect of a clamping mechanism used to clamp the substrate to the chuck 20. According to one embodiment of the invention, all these causes are taken into account simultaneously. However, the different causes could also be dealt with separately as will be explained below.

FIG. 3 further shows a processing unit 31 that is arranged to communicate with a sensor 30 and a memory unit 32. The sensor 30 is arranged to measure the surface of the substrate W in a more accurate way than the level sensor that is discussed above, i.e. the sensor 30 is capable of measuring the height of the substrate W also in the vicinity of the edge of the substrate W. Sensor 30 could for instance be a single-spot level sensor, as is depicted in FIG. 4, but could also be an air gauge or an external profilometer.

Figure 4:
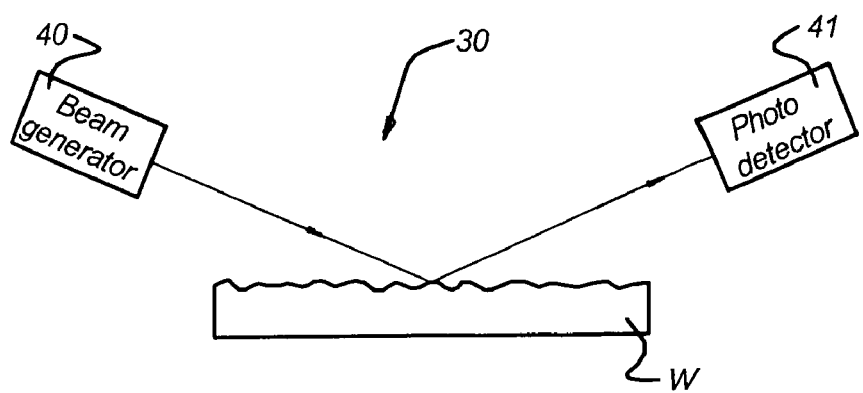
FIG. 4 schematically depicts a sensor according to an embodiment of the invention.

FIG. 4 depicts a beam generator 40 that projects a light beam towards the surface of the substrate W. The beam is reflected by the surface of the substrate W, and the reflected light beam is detected by a photo-detector 41. The substrate W is moved laterally with respect to the beam generator 40 and the photo-detector 41. The reflected beam impinging on the photo-detector 41 provides information about the height of the substrate W at the position where the light beam is reflected, as will readily be understood by a person skilled in the art. By the lateral movement of the substrate W, thus, a height map can be derived, e.g. a set of data comprising height information as a function of position on substrate W. Other sensors 30 may be used instead, such as interferometric sensors, that in FIG. 3 are all represented by sensor 30.

It may be desirable for sensor 30 to measure the height map of the substrate near the edge of the substrate. The measurements done by sensor 30 are processed by the processing unit 31. Based on the measurements done by sensor 30, the processing unit 31 constructs an average height map that is stored in the memory unit 32.

The average height map may contain information about the shape of a certain type of substrate W. As will be discussed below, the information may be based on measurements on one or more substrates W, the chuck, the clamping mechanism used, etc. While the term "average height map" may refer to a map based on more than one measurement, a single measurement could also serve as the basis for an average height map. The information obtained from a single measurement already contains information about the general shape of a certain type of substrate W. The average height map may of course also be based on more than one measurement.

The term "average height map" as used here may be a 2D map comprising height information of positions on the surface of the substrate (z(x,y)), but may also comprise rotational information ($R_x(x,y)$). The average height map may also comprise information indicating that extrapolation of height in the y-direction starting at a certain y-position follows a certain function f(y). So, not always a full 2D relation needs to the calculated as intermediate step between measurement of height and applying the extrapolation scheme.

Figure 5A:
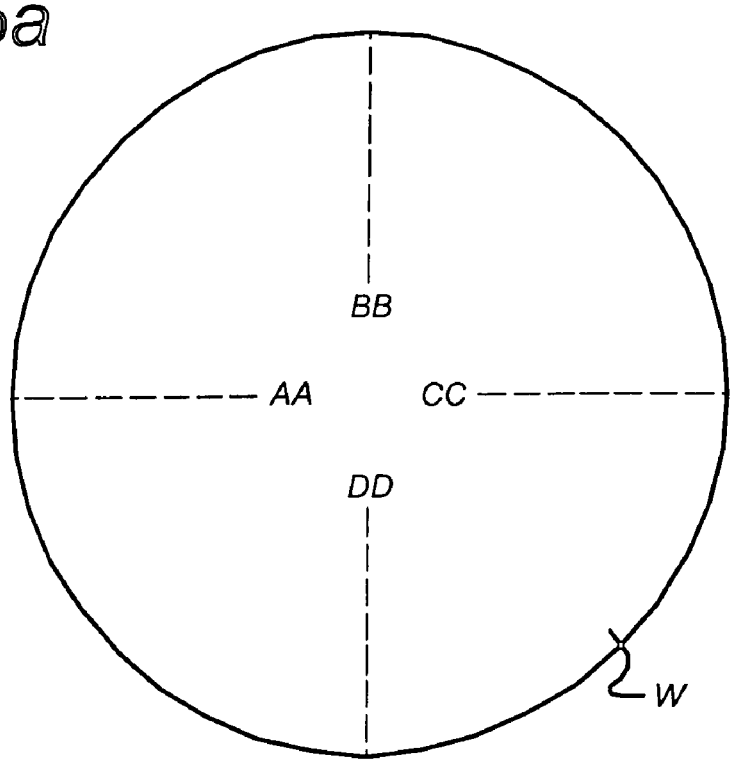
FIGS. 5a and 5b schematically depict a top view of a substrate according to an embodiment of the invention.

The processing unit 31 constructs an average height map based on the measurement performed by the sensor 30. The sensor 30 may measure the height map of the substrate W along a single line AA, perpendicular to the edge of the substrate W, as depicted in FIG. 5a, which shows a top view of a substrate W. Based on such a measurement, information may be obtained about the curvature near the edge of the substrate W. The average height map may be assumed equal to this measured height along line AA, but also processing may be applied to this measured height along line AA, such as smoothing out high-frequency variations, as will be understood by a person skilled in the art. The processing unit may comprise one or more microprocessors or other programmable units (e.g. digital signal processors) and/or dedicated (e.g. preprogrammed or nonprogrammable) units such as field-programmable gate arrays (FPGAs) or other arrays of logic elements.

However, the sensor 30 may also measure the height map of a substrate W along more than one line, such as depicted in FIG. 5a, where the sensor 30 measures the height of the substrate W along four lines AA, BB, CC, DD, perpendicular to different portions of the edge of a substrate W. The measured height along these lines may be processed and/or averaged by the processor 31.

Figure 5B:
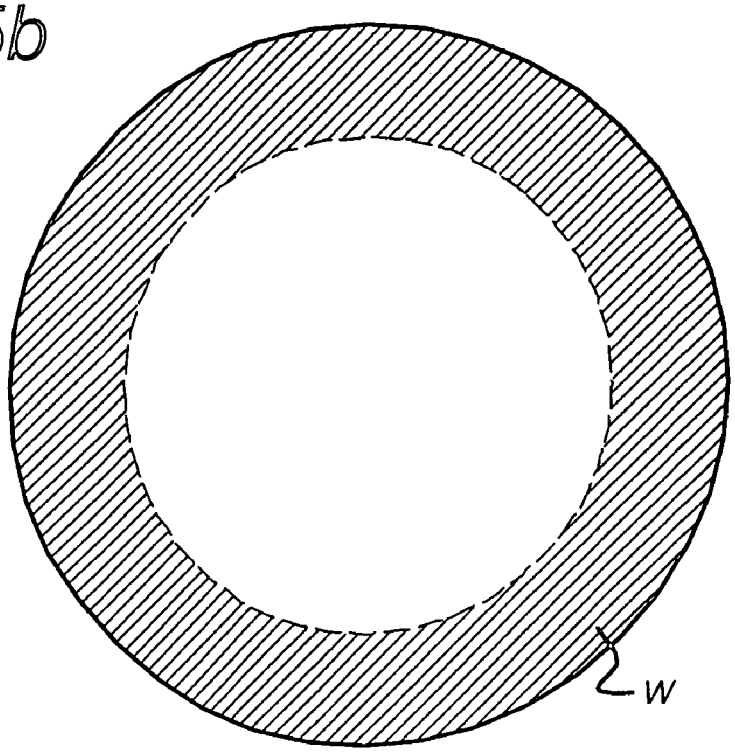

Also, the sensor 30 may be used to measure the height of the substrate W in a ring-shaped area along the edge of the substrate W, as shown in FIG. 5b. A certain type of substrate W could show a different curvature along the edge of the substrate, for instance a saddle shape. It will be understood that all kinds of measurement strategies may be used. The sensor 30 may, for instance, measure the height of more than one substrate W of a batch and calculate an average height map as averaged over that plurality of substrates W.

Since at least some of these proposed measurements are additional measurements to known exposure procedures, they may cost time and therefore reduce the throughput. However, it may be feasible to perform them on only a limited amount of substrates W (for instance, one) and/or on a limited area of the substrate W (for instance, a single line AA).

The constructed average height map may be stored in memory unit 32. FIG. 6 depicts two examples of possible average height maps I and II. Graph I shows an average height map with a height increasing towards the edge of the substrate W, and graph II shows an average height map with a height decreasing towards the edge of the substrate W.

Once the substrates W are measured by the level sensor 15 in order to be subjected to exposure, the information from memory unit 32 is retrieved, for instance, by the same processing unit 31, but it may also be used by another processing unit (not shown). Once the level sensor cannot measure or adequately determine the height or tilt for part of the target portion $C_i$ that may not be completely on the substrate W, an extrapolation is performed in order to estimate the height map of that part of the substrate W. An estimated height map is constructed by extrapolation of height measurements done in neighboring areas. Referring to FIG. 2b, for constructing an estimated height map of a part of target portion $C_1$, height measurements may, for instance, be used from target portions $C_2$, $C_3$. Also height measurements may be obtained from other parts of target portion $C_1$. Based on the estimated height map, the position and orientation of the substrate W can be adjusted in order to position that part of the substrate W as good as possible with respect to the focal plane of the optics.

In applications of some embodiments of the invention, extrapolation of neighboring height measurements can now be done with the use of the previously constructed average height map. In case substrate W is of the first type, showing an upward average height map I (FIG. 6), the extrapolation could use this information to make a more accurate estimation of the height or tilt near the edge of substrate W. Based on the obtained average height map, a suitable extrapolation scheme can be constructed. For instance, if the average height map shows a certain parabolic shape near the edge of the substrate, this same curvature is taken into account in the extrapolation area. Since also the chuck 20 influences the curvature of the substrate near the edge of the substrate W, it may be desirable for the construction of the average height map to be done based on measurements performed on a substrate W positioned on the same, or a similar chuck 20.

The average height map may or may not provide information about the absolute height of the substrate near the edge of the substrate. For example, it is possible that only the information provided by the average height map about the shape of the substrate W near the edge is used. So, the absolute height information may be retrieved from height measurements from neighboring areas on substrate W, while the relative height information may be stored in the average height map. The average height map may therefore also be denoted by an average profile map.

In the embodiment discussed above, all the different causes that could influence the curvature of the substrate W near the edge of the substrate W are taken into account simultaneously. However, it is also possible to produce an average height map taking into account the effect of only part of these effects. For instance, an average height map could be constructed of the curvature created by the clamping mechanism and the shape of the chuck 20 and/or the stone 22. Such an average height map only needs to be generated once for a certain chuck 22 and/or stone 22. Also the influence of the substrate table could be determined separately. An average height (profile) map taking into account the effect of a structure arranged to support a substrate may be determined by measuring the shape of the structure to support a substrate directly, but may also be determined by measuring a substrate positioned on such a structure (for example, a substrate having a particularly flat surface).

Such an average height map may be used in combination with an average height map taking into account the curvature of a certain type of substrate W, or taking into account the effects of processing steps applied to the substrate W. So, different average height maps may be constructed, taking into account different causes. These different average height maps can be used simultaneously. However, it is also possible to use an average height map, taking into account only part of the possible curvature and use this average height map to improve the extrapolation. Although such a solution may not be optimal, reasonable results may be obtained.

A method according to an embodiment of the invention includes measuring at least a first part of at least one substrate belonging to a group, wherein the first part corresponds to a portion of the substrate that may be measured accurately using the level sensor or other measuring device. Computing an average profile map from the measurements taken of the at least first part of the substrate belonging to the group and storing the computed average profile map for use during a later determination of a height or tilt of a substrate from the group. Based on the average profile map, a profile map may be computed for a second part of at least one substrate belonging to the group, wherein the second part corresponds to a portion of the substrate that may not be measured accurately by the level sensor, or other measuring device, and may therefore be constructed using extrapolation of the average profile map from neighboring areas of the substrate. In an alternative embodiment of the invention, the second part may at least partially overlap with the first part.

A method according to a further embodiment of the invention relates to a method for determining a first average profile map of at least the first part of a substrate belonging to a group of substrates and computing at least a second part of at least one substrate belonging to the group, based on an extrapolation of the first average profile map. In one embodiment of the invention, the first average profile map may include a previously constructed average profile map associated with a first type of substrate. The method may further include measuring the first part of a substrate belonging to a group of substrates and storing the measured data. A second average profile map of the at least first part of the substrate belonging to the group may be computed from the measured data and may be used during a later determination of a height or tilt of a substrate from the group. Based on at least one of the first average profile map and the second average profile map, a profile map may be computed for a second part of at least one substrate belonging to the group. In one embodiment of the invention, the second part may be adjacent to the first part. In an alternative embodiment of the invention, the second part may be adjacent to the first part and may at least partially overlap with the first part.

The average profile map may comprise information about the shape of a certain group of substrate. In this text, the term "average height map" may also include an average profile map. This information can advantageously be used to determine height or tilt in parts of a substrate of that group that may not be measured by a level sensor. The term 'group' as used here refers to a group of substrates that are similar in some regard; for example, they may have been subjected to similar processing steps and/or similar patterned beams, they may originate from the same batch, etc. These substrates are assumed to have a similar shape, for instance, near the edge of the substrate. Extrapolation can be done more accurately with the use of this average height map; for instance, the average height map can be used to construct a suitable extrapolation scheme. Especially near the edge of the substrate, where height measurements are more difficult and relatively strong curvature of the substrate is often present, such a method could advantageously be used.

It may be desirable for the first and the second part to at least partially overlap with each other.

In a method according to a further embodiment of the invention, the first part may include a strip along the edge of the substrate. Especially along the edge of the substrate it may be relatively difficult to obtain height or tilt measurements, since the level sensor may be partially outside the substrate in that area.

In a method according to a further embodiment of the invention, measurements for the first part may be obtained using at least one line, wherein each of the at least one lines may be perpendicular to the edge of the substrate.

In a method according to a further embodiment of the invention, the first part may be obtained using at least one line, wherein each of the at least one lines may be perpendicular or parallel to the scan direction during exposure of the substrate.

In a method according to a further embodiment of the invention, the first part may be obtained using a strip along the edge of the substrate. The examples mentioned here for the first part are relatively simple to apply and provide an average profile map of relatively good quality.

In a method according to a further embodiment of the invention, the first part may be measured using a single spot level sensor. A single spot level sensor may be capable of measuring a surface with a high accuracy.

In a method according to a further embodiment of the invention, the measurement of the first part may be performed while the substrate is positioned on a same or similar chuck, as on which the substrate is positioned during the determination of the height. Since the chuck used to position the substrate may not be completely flat, the specific chuck that is used may influence the curvature of the substrate. Every chuck may have a different effect on the curvature of the substrate. Therefore, it may be desirable to construct the average height map based on measurements taken from a substrate positioned on the same chuck that is used to support the substrate during exposures. This approach may only take into account the influence of the chuck on the shape of the substrate. However, the chuck is used many times and its influence may only need to be determined once.

In a method according to a further embodiment of the invention, the chuck is provided with a clamping mechanism that is similar to the clamping mechanism used for supporting the substrate during exposures. Also, the clamping mechanism used to hold the substrate in a certain position may influence the shape of the substrate. Therefore, it may be desirable to use a similar clamping mechanism during the determination of the average height map as during exposures, thus making use of level sensors measurements and the average height map to level the substrate. Such a clamping mechanism could be a vacuum clamping mechanism or a electromagnetic clamping mechanism. The influence of these clamping mechanism on the shape of the substrate during exposure may only need to be determined once.

In a method according to a further embodiment of the invention, the measurements of the first part of the substrate may be performed while the substrate is positioned on a same or similar substrate table, as on which the substrate is positioned during the exposures. The average height map can also be based on information about the shape of the substrate table. This approach may only correct part of the causes that influence the shape of the substrate. However, a substrate table is used many times, and the influence it has on the shape of the substrate may only need to be determined once.

A device manufacturing method according to an embodiment of the invention includes providing a substrate; providing a projection beam of radiation using an illumination system; using a patterning structure to impart the projection beam with a pattern in its cross-section; projecting the patterned beam of radiation onto a target portion of the substrate; determining a height or tilt of a portion of the substrate with a sensor, the target portion being adjacent to the first part of at least one substrate; and determining a height or tilt of the second part of the at least one substrate by extrapolating the height or tilt of the target portion of the substrate based on an average profile map obtained from a first part of the at least one substrate as described herein.

In a device manufacturing method according to a further embodiment of the invention, the sensor may be a multi-spot sensor.

A lithographic apparatus according to an embodiment of the invention includes an illumination system for providing a projection beam of radiation; a support structure for supporting a patterning structure, the patterning structure serving to impart the projection beam with a pattern in its cross-section; a substrate table for holding a substrate; and a projection system for projecting the patterned beam onto a target portion of the substrate. The lithographic apparatus further is arranged to determine an average profile map of at least a first part of a substrate belonging to a group of substrates, and further includes a processing unit arranged to communicate with a sensor and a memory unit, the sensor unit being arranged to measure at least the first part of at least one substrate from that group; the processing unit being arranged to determine the average profile map of the at least first part of the substrate belonging to the group based on the measurement done by the sensor; and the memory unit being arranged to store the average profile map for use during a later determination of a height or tilt of the substrate belonging to the group.

A lithographic apparatus according to a further embodiment of the apparatus includes an illumination system for providing a projection beam of radiation; a support structure for supporting patterning structure, the patterning structure serving to impart the projection beam with a pattern in its cross-section; a substrate table for holding a substrate; and a projection system for projecting the patterned beam onto a target portion of the substrate. The lithographic apparatus further is arranged to determine an average profile map of at least a first part of a substrate belonging to a group of substrates, and further includes a processing unit arranged to communicate with a sensor and a memory unit, the sensor unit being arranged to measure at least the first part of at least one substrate from that group; the memory unit being arranged to store the measured data; the processing unit being arranged to determine the average profile map of the at least first part of the substrate belonging to said group based on the measurement done by the sensor during a later determination of a height or tilt of the substrate belonging to the group.

A method for determining an average profile map according to an embodiment of the invention includes measuring a height profile of at least part of a structure arranged to support a substrate; computing an average profile map of a substrate supported by the structure; and storing the computed average profile map for use during a later determination of height and tilt values to be used during exposure of a substrate. Such a support structure influences the height profile of a substrate that is supported by the support structure. Information about the effect of a certain support structure on the shape of a substrate can be used to construct a more accurate extrapolation scheme for determining the height profile of parts of a substrate that cannot accurately be measured by a level sensor. Such a support structure may not take into account all the causes that have effect on the shape of the substrate, such as the initial shape of a substrate or the effect of the various processing steps the substrate has been subject to. However, it may enable a more accurate extrapolation. A further potential advantage of such a method is that the average height map of a support structure may only need to be determined once for a certain support structure and may not have to be repeated for every new batch.

The term "support structure" as used here with respect to a substrate may denote one or more of the following: chuck, clamping mechanism used to clamp a substrate, substrate table and/or stone. Generally the term also may denote any structure used to support all or part of a wafer (substrate) or mask (reticle) or other patterning structure. Different average height maps taking into account different parts of the support structure may be combined. Average height maps taking into account the support structure may also be combined with average height maps taking into account the shape of a substrate that is not positioned on the support structure.

A method for determining an average profile map of at least a first part of a structure arranged to support a substrate according to an embodiment of the invention includes measuring at least the first part of at least one substrate supported by the support structure, the first part of the at least one substrate being supported by the first part of the support structure; computing an average profile map of the at least first part of the support structure; and storing the computed average profile map for use during a later determination of a height or tilt of a subsequent substrate located on the support structure.

A method for determining an average profile map of at least a first part of a structure arranged to support a substrate according to a further embodiment of the invention includes measuring at least a first part of at least one substrate supported by the support structure, the first part of the at least one substrate being supported by the first part of the support structure; storing the measured data; and computing an average profile map of the at least first part of the support structure during a later determination of a height or tilt of a subsequent substrate located on the support structure. The average profile map may include the effect that the support structure has on the substrate. Such an average profile may be based on measurements applied directly to the support structure, but may also be based on measurements of a substrate supported by such a support structure.

Methods for determining an average profile map of at least a first part of a substrate belonging to a group of substrates are described herein. Device manufacturing methods are also described herein, as well as lithographic apparatus comprising an illumination system for providing a projection beam of radiation; a support structure for supporting a patterning structure, the patterning structure serving to impart the projection beam with a pattern in its cross-section; a substrate table for holding a substrate; and a projection system for projecting the patterned beam onto a target portion of the substrate.

Whilst specific embodiments of the invention have been described above, it will be appreciated that the invention as claimed may be practiced otherwise than as described. For example, embodiments of the invention also include a memory unit or data storage medium (e.g. a unit or medium including a magnetic or phase-change medium such as a disk or CD-ROM or a volatile or nonvolatile semiconductor medium such as ROM, RAM, SDRAM, or flash RAM) storing instructions (e.g. describing a method as disclosed herein) that are executable by an array of logic elements (e.g. a processor). It is explicitly noted that the description of these embodiments is not intended to limit the invention as claimed.

The scope of the invention is determined only by the appended claims.

What is claimed is:

1. A method of determining a map of a surface of a substrate belonging to a group of substrates, said method comprising:
   by using a plurality of target portions, measuring a profile of a part of a surface of a structure arranged to support individual ones of the substrates, said measuring being performed while none of the substrates is present on the surface of the structure;
   measuring part of the surface of the substrate;
   based on a result of measuring said profile and measuring said part of the surface of the substrate, computing the map of the surface of the substrate supported by the structure; and
   storing the map.

2. The method of determining a map of a surface according to claim 1, wherein measuring a profile includes measuring a height profile.

3. A method of determining a map of a surface of a substrate belonging to a group of substrates, said method comprising:
   measuring a height profile of a part of a surface of a structure arranged to support individual ones of the substrates by using a plurality of target portions, said measuring being performed while none of the substrates is present on the surface of the structure;
   measuring part of the surface of the substrate;
   based on a result of measuring said profile and measuring said part of the surface of the substrate, computing the map of the surface of the substrate supported by the structure; and
   storing the map, wherein the map includes an average profile map.

* * * * *